(12) United States Patent
Lin et al.

(10) Patent No.: US 6,743,679 B2
(45) Date of Patent: Jun. 1, 2004

(54) INTEGRATED CIRCUIT DEVICES WITH HIGH AND LOW VOLTAGE COMPONENTS AND PROCESSES FOR MANUFACTURING THESE DEVICES

(75) Inventors: Xi-Wei Lin, Fremont, CA (US); Gwo-Chung Tai, San Jose, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/126,438

(22) Filed: Apr. 19, 2002

(65) Prior Publication Data

US 2002/0164846 A1 Nov. 7, 2002

Related U.S. Application Data

(63) Continuation of application No. 09/261,709, filed on Mar. 3, 1999, now abandoned.

(51) Int. Cl.[7] .......................................... H01L 21/8234
(52) U.S. Cl. ...................... 438/275; 438/532; 438/278; 438/FOR 193; 257/392
(58) Field of Search ................................ 438/275, 532, 438/278, FOR 193; 257/392, E27.059

(56) References Cited

U.S. PATENT DOCUMENTS

| | | |
|---|---|---|
| 4,628,341 A | 12/1986 | Thomas |
| 4,786,609 A | 11/1988 | Chen |
| 5,015,595 A | 5/1991 | Wollesen |
| 5,021,356 A | 6/1991 | Henderson et al. |
| 5,024,960 A | 6/1991 | Haken |
| 5,047,358 A | 9/1991 | Kosiak et al. |
| 5,296,393 A | 3/1994 | Smayling et al. |
| 5,432,114 A | 7/1995 | O |
| 5,468,666 A | 11/1995 | Chapman |
| 5,472,887 A | 12/1995 | Hutter et al. |
| 5,480,830 A | 1/1996 | Liao et al. |
| 5,523,248 A | 6/1996 | Yamazaki |
| 5,563,096 A | 10/1996 | Nasr |
| 5,583,061 A | 12/1996 | Williams et al. |
| 5,867,423 A * | 2/1999 | Kapoor et al. .............. 365/168 |
| 6,051,459 A | 4/2000 | Gardner et al. |
| 6,307,236 B1 * | 10/2001 | Matsuzaki et al. .......... 257/392 |

* cited by examiner

*Primary Examiner*—George Fourson
*Assistant Examiner*—Thanh V Pham
(74) *Attorney, Agent, or Firm*—Peter Zawilski (57) ABSTRACT

The present invention includes a technique for making a dual voltage integrated circuit device. A gate dielectric layer is formed on a semiconductor substrate and a gate material layer is formed on the dielectric layer. A first region of the gate material layer is doped to a first nonzero level and a second region of the gate material level is doped to a second nonzero level greater than the first level. A first field effect transistor is defined that has a first gate formed from the first region. Also, a second field effect transistor is defined that has a second gate formed from the second region. The first transistor is operable at a gate threshold voltage greater than the second transistor in accordance with a difference between the first level and the second level.

10 Claims, 5 Drawing Sheets

INTEGRATED CIRCUIT DEVICES WITH HIGH AND LOW VOLTAGE COMPONENTS AND PROCESSES FOR MANUFACTURING THESE DEVICES

CROSS REFERENCE TO RELATED APPLICATIONS

This application is a continuation filed Mar. 3, 1999 application Ser. No. 09/261,709, now abandoned, which is hereby incorporated by reference in its entirety.

BACKGROUND OF THE INVENTION

The present invention relates to integrated circuit devices having high and low voltage components and techniques for fabricating such devices.

There continues to be a demand for more densely populated and faster integrated circuit devices. To meet these demands, the "on-chip" integrated circuit structural elements continue to be miniaturized, often including a proportional reduction in the gate oxide thickness of Insulated Gate Field Effect Transistors (IGFETs). As the gate oxide thickness decreases, a proportional reduction in operating voltage typically results.

However, the continued decrease in gate oxide thickness generally causes a corresponding decrease in dielectric breakdown voltage. As a result, the breakdown voltage of low voltage components may be less than the output voltage of available power supplies or the operating voltage of external circuits intended to interface with the low voltage components. If gate breakdown voltage is exceeded, the resulting damage typically degrades device performance and reliability. To address this limitation, it is often desirable to have intervening high voltage components operating on the same integrated circuit chip as these low voltage components. One proposed scheme to provide high and low voltage components on the same chip involves the fabrication of gate oxides in different thicknesses. Unfortunately, this approach is exceedingly complex, often resulting in higher manufacturing costs and lower device reliability.

Thus, there is a need for improved integrated circuit devices having both high and low voltage components. There is also a demand for better techniques to provide such voltage devices.

SUMMARY OF THE INVENTION

One form of the present invention is an improved integrated circuit device. This device may include high and low voltage components.

An alternative form of the present invention is an integrated circuit that includes a first component with a first member doped to establish a first operating voltage and a second component with a second member doped to establish a second operating voltage. The second member includes at least two dopants to establish a predetermined difference between the first voltage and the second voltage with one of the dopants being of a first conductivity type and another of the dopants being of a second conductivity type opposite the first conductivity type.

Another alternative form of the present invention includes techniques that provide different dopant levels in different regions of an integrated circuit device. These techniques may be applied to provide transistors with different operating voltages. Such techniques may include doping one region of a gate material level differently from another region to correspondingly define transistors operable at different threshold voltages.

In still another alternative form of the present invention, an integrated circuit device is made by forming a gate dielectric layer on a substrate and establishing a gate material layer on the dielectric layer. A first region of the gate material layer is doped to a first nonzero level and a second region of the gate material layer is doped to a second nonzero level greater than the first level. A first field effect transistor is defined having a first gate formed from the first region and a second field effect transistor is defined having a second gate formed from the second region. The first transistor is operable at a gate threshold greater than the second transistor in accordance with a difference between the first level and the second level.

In a further alternative form, a method of manufacturing an integrated circuit device includes providing a substrate with a first transistor gate and a second transistor gate therealong. The second transistor gate includes a member doped with a dopant of a first conductivity type. The first member and the second member are doped with a dopant of a second conductivity type opposite the first type. This doping provides the first member with a different doping level than the second member, which corresponds to a different threshold voltage for the first gate relative to the second gate.

Other alternative forms of the present invention include, but are not limited to, providing an integrated circuit substrate with a gate dielectric layer positioned on the substrate and a gate material layer positioned on the dielectric layer; where the gate material layer includes polysilicon. A dopant of a first conductivity type is provided in a selected region of the gate material layer. This form also includes patterning the gate dielectric layer and the gate material layer after providing the first conductivity type of dopant to form a number of field effect transistor gates. A first one of the gates is formed from the selected region. The gates and the substrate are doped with a dopant of a second conductivity type opposite the first conductivity type. This doping includes forming a number of doped substrate regions to define a number of transistors corresponding to the gates and establishing a first doping level for the first one of the gates and a second doping level for a second one of the gates. The first doping level corresponds to a first gate threshold voltage and the second doping level corresponds to a second gate threshold voltage different from the first gate threshold voltage.

Further objects, features, benefits, aspects, forms, embodiments, examples, and advantages of the present invention shall become apparent from the detailed drawings and description provided herein.

BRIEF DESCRIPTION OF THE DRAWINGS

For the following figures, like reference numerals representing like features. In some cases, the figures or selected features thereof are not drawn to scale to enhance clarity.

DESCRIPTION OF THE PREFERRED EMBODIMENTS

For the purposes of promoting an understanding of the principles of the invention, reference will now be made to the embodiments illustrated in the drawings and specific language will be used to describe the same. It will, nevertheless, be understood that no limitation of the scope of the invention is thereby intended. Any alterations and further modifications in the described embodiments and any further applications of the principles of the invention as described herein are contemplated as would normally occur to one skilled in the art to which the invention relates.

As used herein, the terms "silicon dioxide" and "oxide" refer broadly to any material containing silicon and oxygen that may include stoichiometric variations and impurities that do not substantially interfere with the desired functional attributes of the material. Furthermore, as used herein, the terms "silicon nitride" and "nitride" refer broadly to any material containing silicon and nitrogen that may include stoichiometric variations and impurities that do not substantially interfere with the desired functional attributes of the material. Furthermore, as used herein, the terms "silicon oxynitride" and "oxynitride" refer broadly to any material containing silicon, oxygen, and nitrogen that may include stoichiometric variations and impurities that do not substantially interfere with the desired functional attributes of the material. A chemical compound formula will be utilized herein to distinguish a specific desired stoichiometric compound of silicon.

FIGS. 1–4 illustrate selected progressive stages 100a-100d of one preferred embodiment of process 100 to provide dual-voltage integrated circuit device 10. Referring to an intermediate processing stage 100a of FIG. 1, integrated circuit device 10 is depicted in a broken view to more clearly designate core circuit component region 10a and Input/Output (I/O) circuit component region 10b along substrate 12. Regions 10a, 10b may be defined along a common active area of substrate 12 or separated from each other by one or more structures or components. In one embodiment, a shallow trench isolation structure is formed in substrate 12 between regions 10a, 10b to electrically isolate them from each other.

It is preferred that substrate 12 be generally planar and formed from a common semiconductor material such as a single-crystal silicon; however, other geometries, compositions, and arrangements of substrate 12 are also contemplated as would occur to those skilled in the art. As depicted, substrate 12 generally extends along a plane perpendicular to the view of the plane of FIG. 1.

Figure 1:
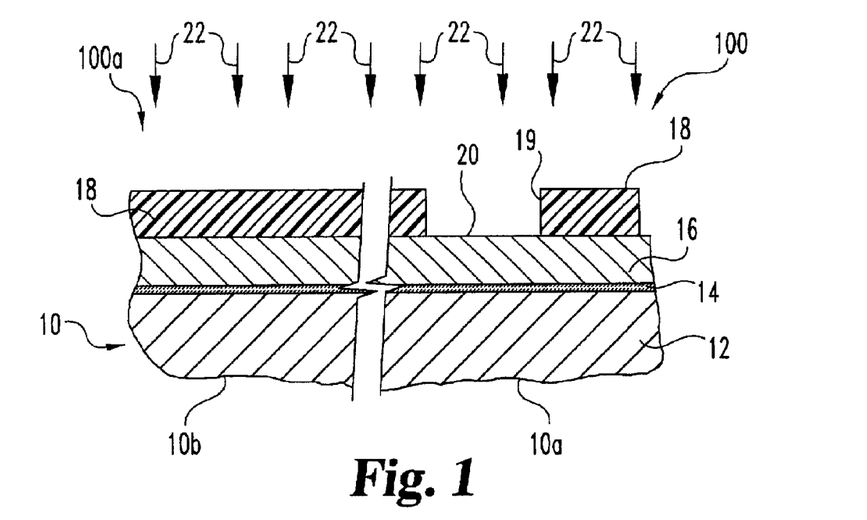
FIGS. 1–4 are partial, sectional views of an integrated circuit device at selected stages of a process of one embodiment of the present invention.

Gate dielectric layer 14 is formed on substrate 12. Preferably, layer 14 is formed from a silicated-based material suitable to serve as a gate insulator. It is also preferred that layer 14 have a thickness of less than about 60 Å. More preferably, layer 14 has a thickness in a range of about 50 to about 10 Å. Most preferably, the thickness of layer 14 is about 40 Å.

Gate material layer 16 is deposited on layer 14. Preferably, layer 16 is comprised of amorphous silicon and has a thickness of at least about 1500 Å. More preferably, layer 16 includes amorphous silicon and has a thickness of at least about 2000 Å. Selected regions of layer 16 are used to prepare gate members as more fully described hereinafter.

Mask 18 is formed on layer 16. Preferably, mask 18 is comprised of a photoresist material patterned by application of standard photolithographic techniques. The patterning of mask 18 provides representative opening 19 which exposes a representative region 20 of layer 16. Region 20 is heavily doped with either an n+ or p+ type dopant as represented by arrows 22 in FIG. 1.

Figure 2:
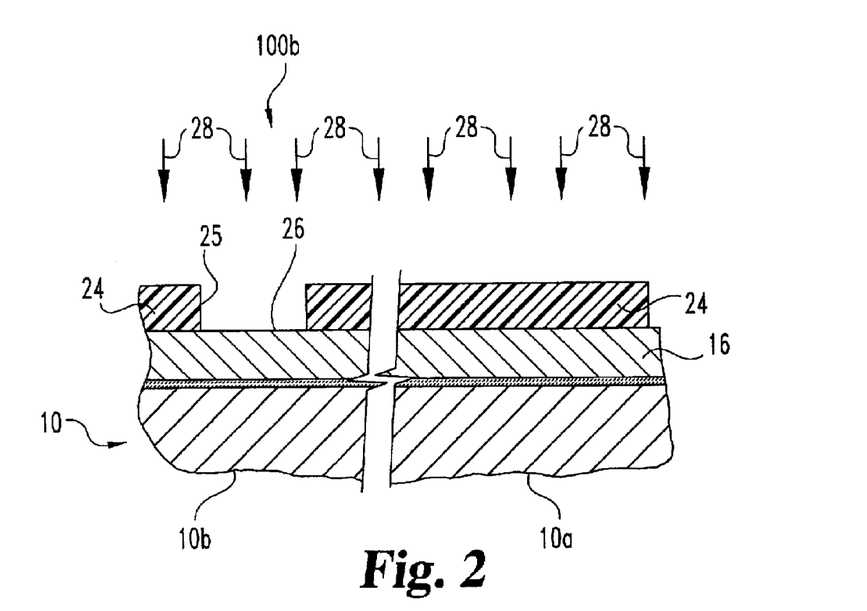

Referring to stage 100b of FIG. 2, mask 18 has been removed, and a second mask 24 deposited on layer 16. Mask 24 is patterned using standard lithographic techniques to define opening 25 exposing region 26 of layer 16. Region 26 is lightly doped relative to region 20 with a dopant n– or p– of the same conductivity type as used for region 20. This doping operation is represented by arrows 28. Preferably, doping is performed by implantation of a species corresponding to the selected conductivity type. In other embodiments, a mask for light n–, p– doping may not be utilized. Instead, layer 16 may be uniformly lightly doped throughout and selected regions (like region 20) may be more heavily doped using an appropriate mask. In these selected regions, light and heavy doping is cumulative, being of the same conductivity type.

For both stages 100a, 100b, the doping operation represented by arrows 22, 28 is preferably performed by ion implantation using one or more species suitable for the desired dopant conductivity type. More preferably, for the p+, p– conductivity type, Boron (B) may be implanted in the form of a B11 or $BF_2$ species; and for the n+, n– conductivity type, Arsenic (As) or Phosphorus (P) may be implanted. In another more preferred embodiment, heavy doping of region 20 is performed by implantation to a minimum level of about $4 \times 10^{19}$ cm$^{-3}$ and light doping is performed by implantation to a maximum level of about $3 \times 10^{18}$ cm$^{-3}$; with layer 16 being comprised of amorphous silicon.

After doping, mask 24 is stripped using standard techniques to re-expose layer 16 with differently doped regions 20 and 26. Referring to stage 100c of FIG. 3, after removing mask 24, the selectively doped layer 16 is blanketed with a dopant blocking material in the form of a film or layer 30. Layer 30 is provided to protect regions 20 and 26 from alteration by one or more subsequent processing operations—particularly subsequent ion implantation operations. Preferably, layer 30 is comprised of at least one of the group of silicon oxide, silicon oxynitride, or silicon nitride. More preferably, layer 30 is comprised of silicon oxynitride or silicon nitride that is in a form suitable to operate as an Antireflective Coating (ARC) during subsequent photolithographic processing. In other embodiments, one or more additional layers or films may be formed between layer 16 and layer 30.

Figure 4:
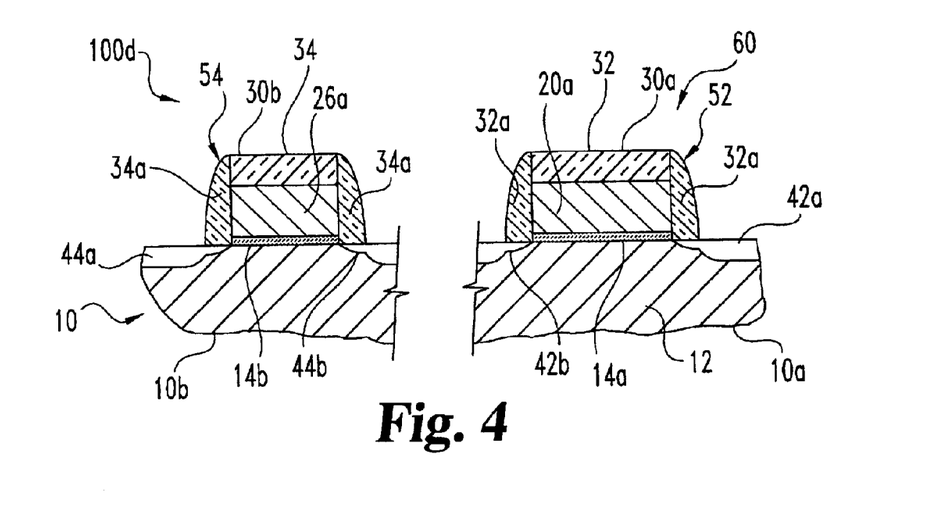

Following deposition of layer 30; layers 14, 16, and 30 are patterned using standard lithographic techniques to define gate structures 32, 34 as depicted at stage 100d of FIG. 4. Gate structures 32, 34 include gate dielectric pads 14a, 14b formed from layer 14; gate members 20a, 26a formed from layer 16; and protective caps 30a, 30b formed from layer 30. Gate members 20a, 26a are formed from doped regions 20 and 26, respectively. Structure 32 is bounded by a pair of sidewall spacers 32a and structure 34 is bounded by a pair of sidewall spacers 34a. Preferably, sidewall spacers 32a, 34a are formed from a silicon nitride or silicate-based insulative material; however, other compositions as are known to those skilled in the art additionally or alternatively may be utilized. Preferably, spacers 32a, 34a are formed on the vertical sides of gate members 20a, 26a by performing a Chemical-Vapor Deposition (CVD) of the spacer material on device 10 and then anisotropically etching to provide the desired spacer shape.

In stage 100d, substrate 12 includes doped substrate source/drain regions 42a, 42b that cooperate with an oppositely doped channel region of substrate 12 under structure 32 to collectively define an Insulated Gate Field Effect Transistor (IGFET) 52. Doped substrate source/drain regions 44a, 44b cooperate with an oppositely doped channel region of substrate 12 under structure 34 to define IGFET 54. To provide an appropriately doped channel region, substrate 12 may be uniformly p– or n– doped before stage 100a. Accordingly, npn or pnp junctions are defined after subsequent doping in selected substrate areas with dopant of a conductivity type opposite the type initially used to dope substrate 12. For example, for an initial uniform p– or n– doping of substrate 12, regions 42a, 42b, 44a, 44b are defined with an n+ or p+ dopant, respectively. When both npn and pnp junction combinations are desired in device 10, as in a Complementary Metal Oxide Semiconductor (CMOS) application, front-end processing may include the selective formation of one or more lightly doped wells in substrate 12 with a dopant conductivity type opposite the type utilized for uniform doping. In still other embodiments, substrate 12 may be initially prepared to provide a desired semiconductor junction arrangement as would otherwise occur to those skilled in the art.

IGFET 52 is one of the components 60 in component region 10a and IGFET 54 is one of the components 60 in component region 10b. Preferably, IGFETs 52, 54 operate as high and low voltage transistors, respectively. The establishment of the operating voltage levels for IGFETs 52, 54 relates to the different dopant levels in members 20a, 26a as will be more fully described hereinafter in connection with FIGS. 8 and 9. In a more preferred embodiment, member 20a is doped to a dopant level that is at least an order of magnitude greater than the dopant level for member 26a. Correspondingly, gate threshold voltages IGFETs 52,54 may be set at different levels to provide a predetermined difference therebetween. Preferably, this difference is at least 0.3 volts.

It is preferred that substrate regions 42a, 42b, 44a, 44b be doped utilizing an implantation operation after formation of structures 32, 34; however other doping techniques may additionally or alternatively be utilized. In the preferred embodiment where the minimum dopant level in member 20a is about $4 \times 10^{19}$ cm$^{-3}$ and the maximum dopant level in member 26a is about $3 \times 10^{18}$ cm$^{-3}$, the maximum dopant level in the substrate regions 42a, 42b, 44a, 44b is preferably about $3 \times 10^{20}$ cm$^{-3}$.

It is also preferred that IGFETs 52, 54 be formed with Lightly Doped Drain (LDD) features. In one preferred process for providing LDD features, substrate 12 is lightly doped in regions corresponding to 42a, 42b, 44a, and 44b after formation of structures 32, 34; but before formation of sidewall spacers 32a, 34a. This light doping preferably is performed with the same dopant conductivity type as for the doping operations of stages 100a, 100b. The sidewall spacers 32a, 34a are then formed using standard techniques. After spacer 32a, 34a formation, a heavy doping operation is performed on surfaces of substrate 12 that remain exposed using a dopant of the same conductivity type as utilized for the light doping operation. Notably, sidewalls 32a, 34a mask parts of the lightly doped areas thereunder.

The doping profile represented in FIG. 4 corresponds to the resulting shallower LDD doping under the sidewall spacers 32a, 34a relative to areas of the substrate regions 42a, 42b, 44a, 44b not covered by sidewall spacers 32a, 34a or structures 32, 34. Also, in other embodiments, LDD features may be provided using other techniques known to those skilled in the art, or may be absent. In other alternative embodiments, spacer sidewalls 32a or 34a may be absent.

Notably caps 30a, 30b may operate to substantially prevent penetration by dopants utilized to dope substrate 12. If necessary for subsequent processing, caps 30a, 30b may be removed after doping of substrate 12. Also, once substrate doping is complete, device 10 is annealed to suitably distribute and activate dopants in substrate 12 and members 20a, 26a. The formation of IGFETs 52, 54 also typically converts the amorphous silicon preferred for members 20a, 26a into polycrystalline silicon (alternatively designated "polysilicon" or "poly").

Figure 3:
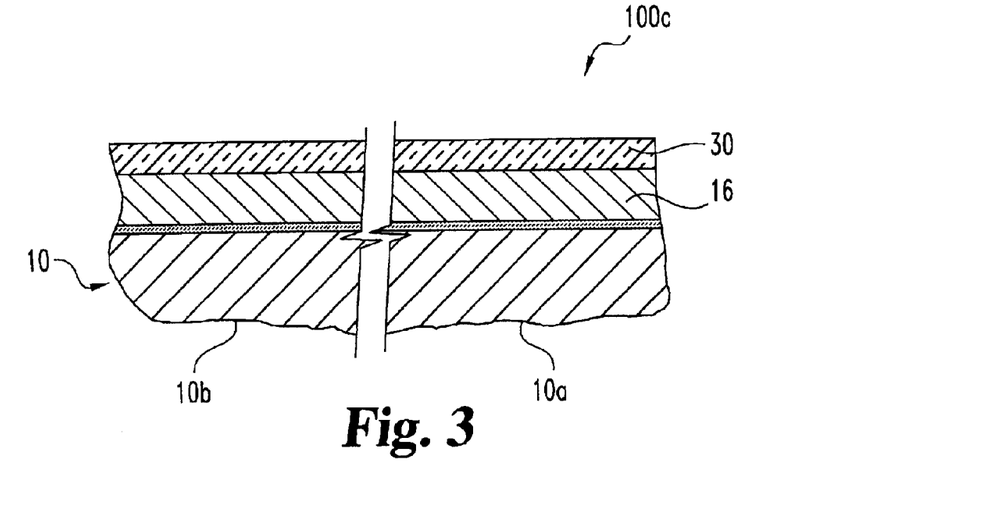

In one preferred alternative embodiment including LDD features, operations corresponding to stages 100b and 100c are not utilized after region 20 is heavily doped. Instead, region 26 is doped at the same time the substrate is doped. If the cumulative dopant level from substrate doping operations is greater than the desired level for region 26, then region 26 may be protectively capped at an appropriate point during processing to reduce or prevent excessive dopant penetration. Alternatively, doping of region 20 during stage 100a may be adjusted to provide a desired dopant level by accumulating dopants of subsequent doping operations, making it unnecessary to provide a protective cap. Further, it should be understood that a plurality of regions 20, 26, or both may be selectively doped by forming multiple openings in the respective mask 18 or 24, as appropriate, to provide a corresponding number of IGFETs with differently doped gate members; however, such additional regions have not been shown to preserve clarity.

Preferably, electrical contacts are selectively formed with components 60 after stage 100d. Connection areas may be formed along silicon surfaces of components 60 by contacting these surfaces with an appropriate metal layer, such as tungsten (W), titanium (Ti), cobalt (Co), tantalum (Ta), or platinum (Pt); and then annealing device 10 as appropriate to selectively form silicide/polycide contact sites. Such techniques may also be used to selectively enhance conductivity of various features of device 10. One or more metallization layers may be fabricated to selectively contact and interconnect silicide/polycide contact sites of components 60. Further, contact pads for interconnecting device 10 to separate, external devices may be established. Such contact pads may be selectively interconnected to components 60 via the metallization layers. Alternatively or additionally, the teachings of commonly owned co-pending U.S. patent applications designated by Ser. Nos. 08/885,302 to Lin et al. or 08/886,170 to Lin, both filed on Jun. 30, 1997, may be adapted to facilitate self-aligned metallization of device 10 and are hereby incorporated by reference in their entirety. After electrical interconnections are formed, it is preferred that device 10 be processed for packaging including the formation of external electrical contacts, such as wire bonds, with any established contact pads as appropriate.

Figure 5:
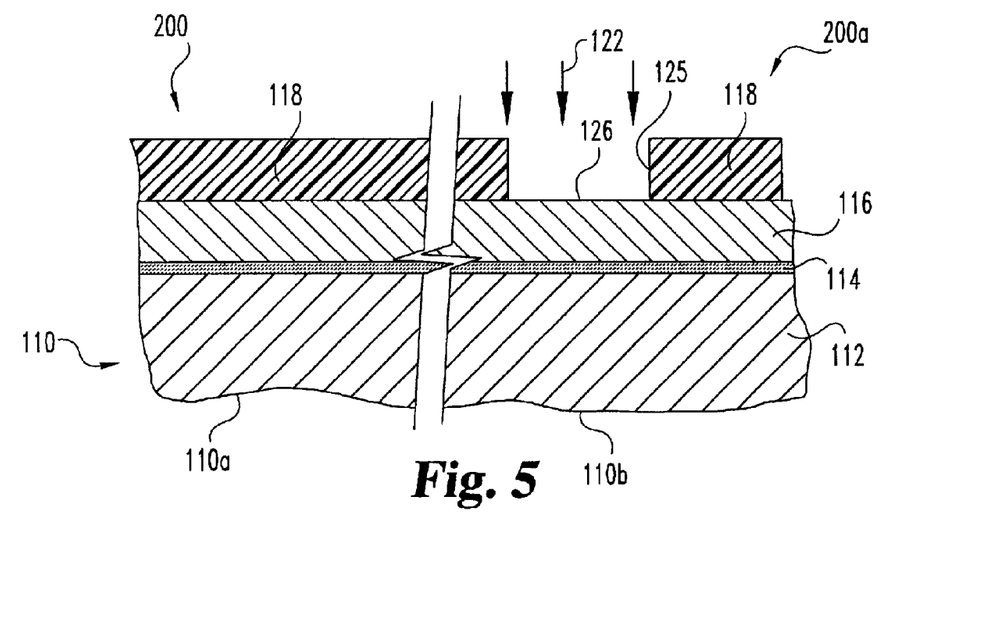
FIGS. 5–7 are partial, sectional views of an integrated circuit device at selected stages of a process of a second embodiment of the present invention.
Figure 6:
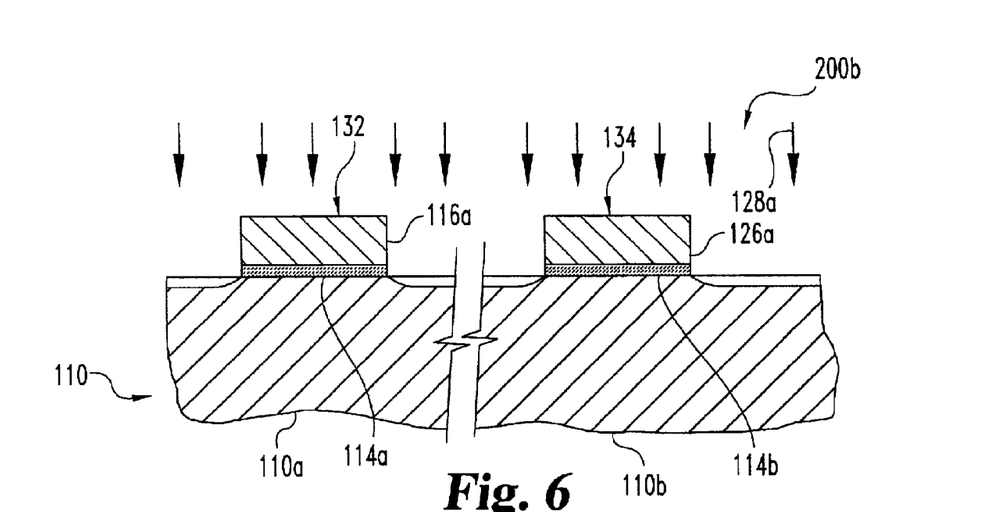
Figure 7:
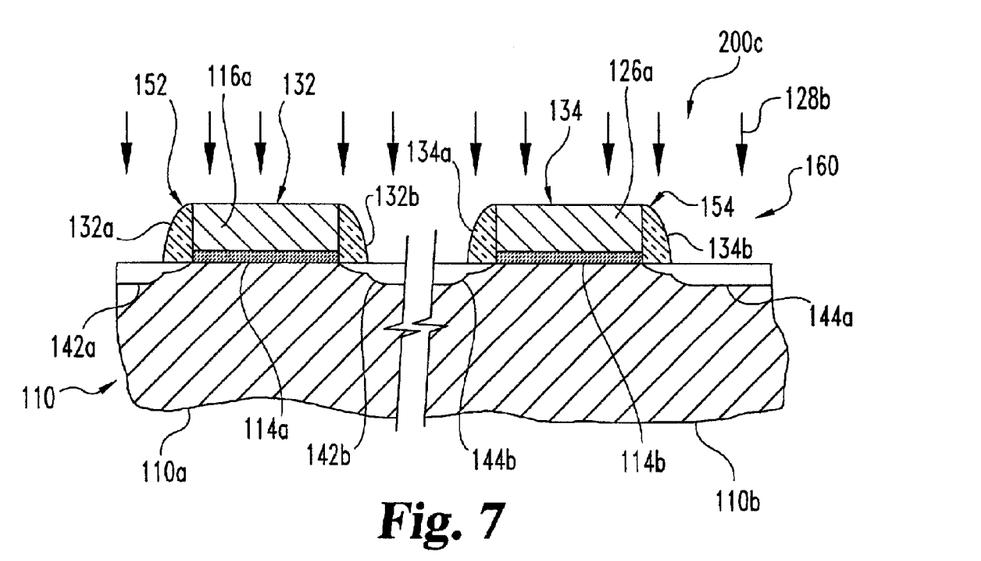

In an alternative embodiment, process 200 is utilized to prepare an integrated circuit device 110. Selected stages 200a–200c of process 200 are illustrated in FIGS. 5–7, respectively. Referring to intermediate processing stage 200a of FIG. 5, an integrated circuit device 110 is illustrated in cross-section. Device 110 includes substrate 112 preferably formed in the same manner as substrate 12. Dielectric layer 114 is deposited on substrate 112. Preferably dielectric layer 114 includes a suitable gate dielectric that can be utilized to form insulative gate pads of corresponding field effect transistors. In one preferred embodiment, layer 114 is comprised of a suitable gate oxide.

After deposition of layer 114, gate material layer 116, preferably comprised of amorphous silicon, is deposited on layer 114. Layers 114 and 116 of device 110 may be formed, composed, or dimensioned in substantially the same manner as layers 14, 16 of device 10. Mask pattern 118 is formed on top of layer 116 using standard techniques, and is preferably composed of a common photoresist material. Pattern 118 includes opening 125 that exposes region 126 of layer 116. While in FIG. 5 only one region 126 is illustrated, it is understood that device 110 preferably includes a number of such selected regions 126, which are used to provide a number of like components of device 110. These additional regions 126 are not shown to enhance clarity.

In stage 200a, n+ or p+ doping of region 126 is performed as represented by arrows 122. As will be more fully described hereinafter, the dopant conductivity type for this doping operation is selected to be opposite the conductivity type desired for an operational component formed from region 126. For initial p+ doping of region 126, it is preferred that a masked boron implant be performed using B11 or $BF_2$; and for initial n+ doping of region 126, it is preferred that implantation be performed using As or P. After initial doping of region 126, pattern 118 is stripped off.

Referring to stage 200b of FIG. 6, after initial doping of region 126, further component fabrication is performed. Gate structure 132 is formed in core component area 110a of device 110 and gate structure 134 is formed in peripheral, depletion mode component area 110b of device 110. Gate structures 132, 134 are preferably formed by etching layers 114, 116 to form pads 114a, 114b and gate members 116a, 126a. Member 126a is formed from the initially doped region 126, while member 116a is not. In stage 200b, device 110 is lightly doped with a dopant having a conductivity type opposite the doping of region 126. This second doping operation is represented by arrows 128a and preferably includes an implantation procedure of an appropriate species. For example, if region 126 is initially doped with boron, then arsenic or phosphorus would be appropriate dopants for the dopant operation represented by arrows 128a.

The light n− or p− doping of device 110 in stage 200b is preferred to form LDD regions in substrate 112. Also, because members 116a, 126a are exposed, this second doping operation lightly dopes member 116a and counter-dopes the dopant previously provided to region 126 during stage 200a.

Referring additionally to stage 200c of FIG. 7, components 160 of integrated circuit device 110 are illustrated. Components 160 include low voltage transistor component 152 in core circuit component area 110a of device 110 and high voltage transistor component 154 in peripheral, depletion mode component area 110b of device 110. Transistor components 152, 154 include corresponding gate structures 132, 134. A pair of insulative sidewall spacers 132a and 132b are formed on opposite sides of structure 132, and a pair of insulative sidewall spacers 134a and 134b are formed about gate structure 134. Spacers 132a, 132b, 134a, and 134b may be fabricated using techniques in connection with spacers 32a, 34a of process 100 and preferably are comprised of a silicate-based material.

Transistor component 152 includes doped substrate regions 142a and 142b, corresponding to source/drain areas that cooperate with an oppositely doped channel under pad 114a to define corresponding semiconductor junctions. Transistor component 154 comprises doped substrate regions 144a and 144b, corresponding to source/drain areas that cooperate with an oppositely doped channel under pad 114b to define corresponding semiconductor junctions. To provide appropriate channel region doping, substrate 112 may be processed in the manner described for substrate 12 in stage 100d.

Heavy n+ or p+ doping of regions 142a, 142b, 144a, 144b is represented by arrows 128b in FIG. 7. The heavy doping operation of stage 200c utilizes a dopant conductivity type opposite that used to selectively dope region 126 in stage 200a, but the same as that used to lightly dope in stage 200b. Not only does the doping shown in stage 200c establish desired semiconductor junctions, but also provides desired doping levels for gate members 116a, 126a. Member 116a becomes heavily doped, while counter-doping of member 126a continues to a level that changes the majority carrier type in member 126a to the type opposite that provided by doping at stage 200a. As a consequence, carrier concentration levels in members 116a, 126a correspond to heavy and light doping with the same conductivity type, respectively, through the doping operation of stage 200c.

To arrive at a desired difference in carrier concentration between member 116a and 126a after stage 200c, the level of doping in stage 200a may be correspondingly adjusted. Preferably, the majority carrier concentration of member 116a relative to 126a differs by at least one order of magnitude. In alternative embodiments, multiple substrate doping operations may not be desired. Instead, substrate 112 may only be doped once after the stage 200a doping operation with a dopant having a conductivity type opposite the type used for doping region 126. Accordingly, the levels of dopant introduced in region 126 at stage 200 and in either stage 200b or 200c to members 116a, 126a may be adjusted to provide the respective carrier concentration desired. Preferably, when n+ source/drain substrate regions 142a, 142b, 144a, 144b are desired, the doping operation includes implantation of a dopant selected from the group of arsenic (As), phosphorous (P), or both. Preferably, when p+ source/drain substrate regions 142a, 142b, 144a, 144b are desired, the doping operation includes implantation of a boron species such as B11 or $BF_2$.

Thus, in one preferred example suitable to provide n-type field effect transistor devices (such as NMOS field effect transistors, or n-type IGFETs), region 126 is initially doped p+ by implanting boron in the form of a B11 species, $BF_2$ species, or both. In stage 200c and stage 200d, doping operations, as represented by arrows 128a, 128b, respectively; are performed by implanting arsenic (As) into members 116a, 126a, and substrate regions 142a, 142b, 144a, 144b. Consequently, member 116a is a heavily doped (n+) feature and, through counter-doping, member 126a changes to a lightly doped (n−) feature.

In another preferred example suitable to provide p-type field effect transistor devices (such as PMOS field effect transistors or p-type IGFETs), region 126 is initially doped n+ by implanting As, P or both. In stage 200c and stage 200d, doping operations as represented by arrows 128a, 128b, respectively are performed by implanting a boron dopant into members 116a, 126a, and substrate regions 142a, 142b, 144a, 144b. Accordingly, p+ and p− members 116a, 126a are provided, respectively.

After doping in stage 200c, device 110 is annealed to distribute and activate the applied dopants. Fabrication of device 110 may then be completed as described for device 10, or as would otherwise occur to those skilled in the art. Typically, for the preferred amorphous silicon composition of layer 116, processing of device 110 transforms the amorphous silicon into polysilicon. Notably, the counter-doping of process 200 does not require a dielectric blocking layer on top of gate members 116a, 126a. Therefore, this process is fully compatible with silicide processing where both polysilicon gates and silicon source/drain active areas are silicided simultaneously.

It has been found that the relatively thicker gate dielectric suitable for high voltage transistors may be realized in effect by using a thin gate dielectric suitable for low voltage transistors with a relatively lightly doped n− or p− conductive gate member, such as members 26a, 126a. While it is not intended that the present invention be limited or otherwise restricted to any proposed theory or mechanism of operation, it is believed a depletion layer is formed in at least a part of the lightly doped gate members when a relatively high voltage is applied thereto. Thus, the peak electric field is distributed over both the gate dielectric pad and the depletion layer portion of the lightly doped gate member. The portion of the electric filed across the physical gate dielectric decreases with the formation of a depleted region—in effect providing a higher gate breakdown voltage. This arrangement may be treated as a significantly thicker gate dielectric than its actual thickness for a given set of device fabrication and operating parameters. The potential distribution across the gate may be expressed by: $V_{eff} = V_g - V_{poly}$; where $V_{eff}$=effective voltage across the gate pad, $V_g$=actual voltage applied to the gate, and $V_{poly}$=voltage drop across the gate due to depletion layer formation. This model of potential distribution is further schematically presented for a lightly doped polysilicon gate member with a standard silicate-based dielectric gate pad in FIG. 8.

Figure 8:
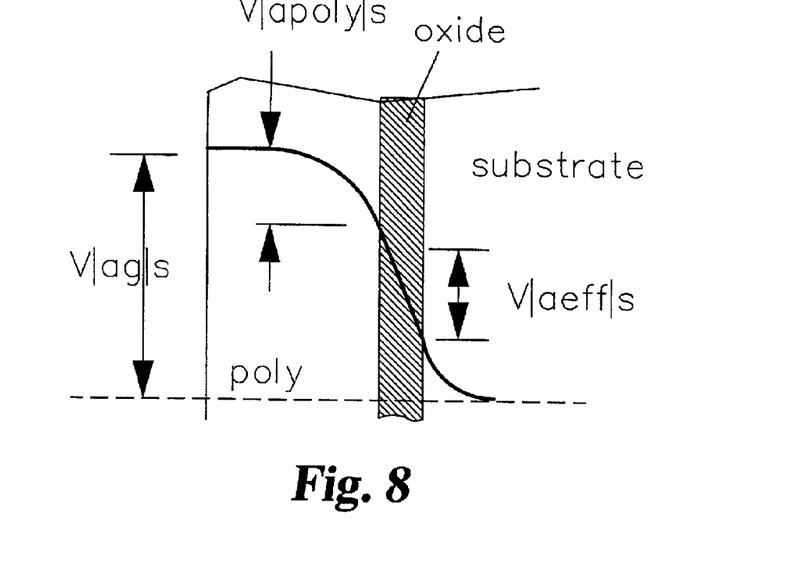
FIG. 8 is a diagram illustrating electric potential distribution in a lightly doped polysilicon member of a transistor gate.

Furthermore, it is thought that when a low voltage is applied to a gate member with lighter doping sufficient to provide a depletion portion at a relatively higher voltage, the effective depletion layer depth correspondingly becomes shallower and approximates the physical gate dielectric. Because of this property, bias voltage swing behavior may be ameliorated. Also, turn-on of the high voltage device may be accomplished at a lower voltage relative to a gate that has a thicker gate dielectric.

Figure 9:
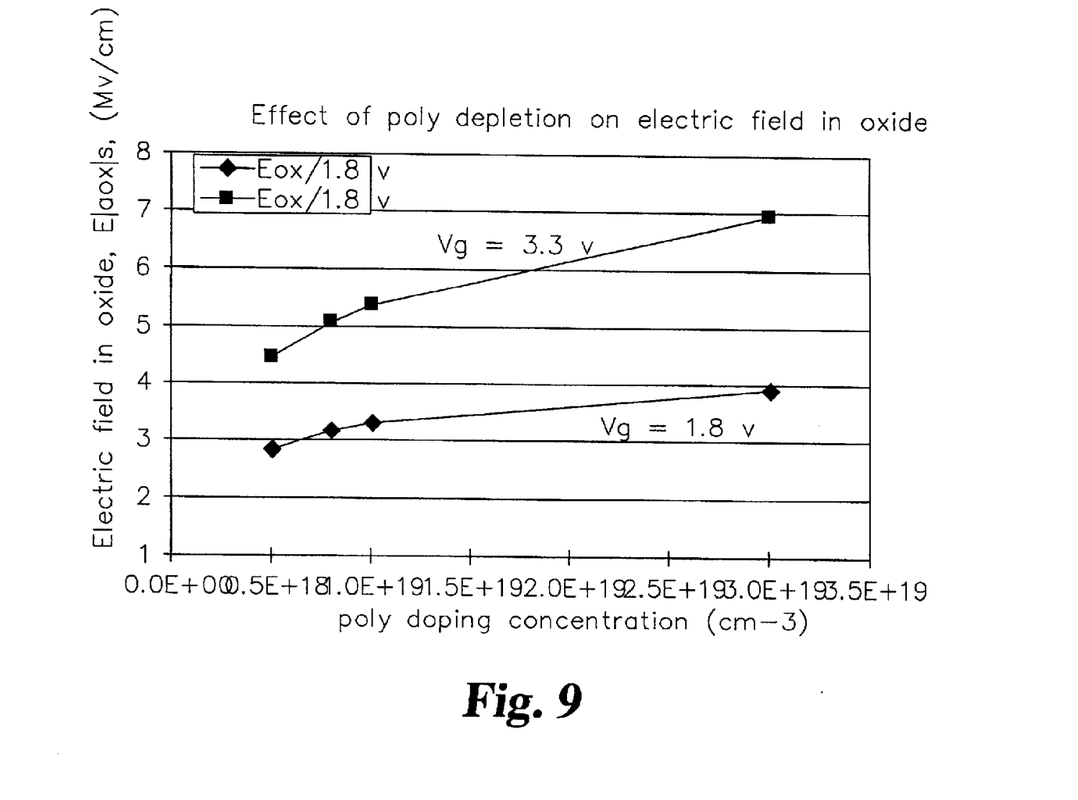
FIG. 9 is a chart illustrating results of a simulation relating electric field in a gate oxide dielectric to dopant concentration in a polysilicon member of a gate for two different gate voltages, $V_g$.

Referring to FIG. 9, changes in the electric field strength in a standard silicate-based dielectric gate pad having a thickness of about 40 Angstroms are simulated over a range of gate member carrier concentrations. Computer simulation was conducted utilizing a Technology Computer Aid Design (TCAD). Two curves corresponding to gate voltages of $V_g$=3.3 and $V_g$=1.8 volts are illustrated. For this simulation, the substrate is silicon with a dopant level held constant at about $10^{17}$ cm$^{-3}$ and the gate member is polysilicon. Notably, the electric field strength drops several megavolts (Mv) per centimeter (Mv/cm) for Vg=3.3 v with a decrease in the gate member carrier concentration of about one order of magnitude. Similarly, over a 1 Mv/cm drop occurs for $V_g$=1.8 v with a decrease in the gate member carrier concentration of about one order of magnitude.

In contrast to the lightly doped gate members, heavily doped n+ or p+ gate members, such as members 20a, 116a, that are otherwise arranged the same as the high voltage components, operate at lower voltage in the usual manner. The thickness of layers 14, 114 (and corresponding pads 14a, 14b, 114a, 114c) are preferably sized to provide these low voltage components in the usual manner. Thus, even with the same gate dielectric thickness, the gate threshold voltages of one component relative to another on the same integrated circuit device may be adjusted in accordance with a difference in dopant level or carrier concentration in the respective gate member. Likewise, in this manner, a predetermined difference in transistor gate operating voltage may be established between two components of the same integrated circuit device. In one preferred embodiment, the difference between gate threshold voltages of low and high voltage transistor components formed in accordance with the present invention is at least about 0.3 volts. In one more preferred embodiment, the low voltage transistor operates at a voltage of about 1.8 voltage and the high voltage transistor operates at a voltage of about 2.5 volts. In another more preferred embodiment, the low voltage transistor operates at a voltage of about 2.5 volts and the high voltage transistor operates at a voltage of about 3.3 volts. In still another more preferred embodiment, the low voltage transistor operates at a voltage of about 1.5 volts and the high voltage transistor operates at a voltage of about 2.5 volts. Most preferably, the difference between the high and low voltage transistors is in a range of about 0.3 to about 2 volts.

Process 100, 200 and devices 10, 110 are but a few of many embodiments of the present invention. For the devices 10, 110 only a few components 60, 160 are illustrated to preserve clarity; however, it is understood that a large number of semiconductor device components may be spaced along the corresponding substrate 12, 112 for simultaneous processing in accordance with the present invention. It is preferred that a plurality of high voltage I/O transistors be simultaneously formed in component area 110a, 110a from a corresponding number of members 26a, 126a in accordance with the teachings of the present invention. It is also preferred that a plurality of low voltage core circuit transistors be simultaneously formed in a component area 110b, 110b from a corresponding number of members 20a, 116a utilizing the teachings of the present invention. An additional number of openings may be formed in the masks or patterns used for selectively doping the gate material layer in processes 100 or 200 to correspondingly define selected doped regions from which these additional gate members may be formed.

In alternative embodiments, one or more of the layers, masks, patterns, substrates, or coatings of device 10, 110 may be comprised of two or more films or constituents arranged to function as a common layer in accordance with the present invention. Also, further layers and films (not shown) may be temporarily or permanently applied to device 10, 110 in accordance with the present invention. By way of nonlimiting example, when any of the doping operations include ion implantation, a screen oxide film may be applied to continuously or selectively cover device 10, 110. This screen oxide film may later be removed in whole or in part to facilitate subsequent processing, such as silicidation. Integrated circuit devices in accordance with the present invention may additionally or alternatively include transistors of different types, memory components, resistors, capacitors, or other active and passive components as would occur to those skilled in the art.

It should be noted that implementation of the disclosed embodiments of the present invention is not limited to the depicted process flows in the figures. It is understood that preparation of semiconductor devices in accordance with the present invention may be incorporated in other process flows known to those skilled in the art. Moreover, processes of the present invention may be altered, rearranged, substituted, deleted, duplicated, combined, or added to other processes as would occur to those skilled in the art without departing from the spirit of the present invention. Additionally or alternatively, the various stages, steps, procedures, techniques, phases, and operations within these processes may be altered, rearranged, substituted, deleted, duplicated, or combined as would occur to those skilled in the art.

All publications, patents, and patent applications cited in this specification are herein incorporated by reference as if each individual publication, patent, or patent application was specifically and individually indicated to be incorporated by reference and set forth in its entirety herein. While the invention has been illustrated and described in detail in the drawings and foregoing description, the same is considered to be illustrative and not restrictive in character, it is understood that only the preferred embodiments have been shown and described and that all changes, modifications and equivalents that come within the spirit of the invention as defined by the following claims are desired to be protected.

What is claimed is:

1. A method of making an integrated circuit device, comprising:

forming a gate dielectric layer on a semiconductor substrate;

establishing a gate material layer on the dielectric layer;

doping the gate material layer, a first region of the gate material layer being doped with at least one preponderant dopant of a first conductivity type to a first nonzero level and a second region of the gate material layer being doped with at least one dopant of the first conductivity type to a second nonzero level greater than the first level; and defining a first field effect transistor having a first gate formed from the first region and a second field effect transistor having a second gate formed from the second region after said doping, the first transistor being operable at a gate threshold voltage greater than the second transistor in accordance with a difference between the first level and the second level.

2. The method of claim 1, wherein said doping includes:

covering the second region with a first mask, the first mask exposing the first region;

implanting a dopant in the first region;

removing the first mask;

covering the first region with a second mask, the second mask exposing the second region;

implanting the dopant in the second region; and removing the second mask.

3. The method of claim 1, wherein the gate material layer includes polysilicon and the first region and the second region are doped with at least one dopant of the same conductivity type during said doping.

4. The method of claim 3, wherein said defining includes patterning the gate dielectric layer and the gate material layer after said doping to provide the first and second gates and implanting a dopant in the substrate to define a source and drain for each of the first and second transistors.

5. The method of claim 4, further comprising covering the device with a dopant blocking layer after said doping and before said implanting to prevent alteration of the first and second levels by said implanting.

6. The method of claim 5, wherein the blocking layer includes silicon nitride or silicon oxynitride.

7. The method of claim 1, wherein the second level is at least about an order of magnitude greater than the first level and the difference between the gate threshold voltage of the first transistor and the second transistor is at least 0.3 volt.

8. The method of claim 7, wherein the gate dielectric layer is formed from a material containing silicon and oxygen and has a generally uniform thickness of less than about 60 angstroms.

9. The method of claim 1, wherein said defining further includes forming a first number of transistors along the substrate with a first gate threshold voltage and a second number of transistors along the substrate with a second gate threshold voltage, the first gate threshold voltage being at least 0.3 volt greater than the second gate threshold voltage.

10. The method of claim 1, further comprising determining a desired threshold voltage for operating the first gate and selecting the first level in accordance with the desired threshold voltage to operate the first gate with a depletion layer, the depletion layer providing an effective gate dielectric thickness greater than actual thickness of the gate dielectric layer.

* * * * *